United States Patent [19]

Sowards

[11] Patent Number: 6,104,985
[45] Date of Patent: Aug. 15, 2000

[54] DEVICE FOR CLASSIFYING ELECTRONIC COMPONENTS

[75] Inventor: Steven R. Sowards, Nampa, Id.

[73] Assignee: Micron Electronics, Inc., Nampa, Id.

[21] Appl. No.: 09/026,871

[22] Filed: Feb. 20, 1998

[51] Int. Cl.$^7$ .................................................. G01R 31/00
[52] U.S. Cl. ....................... 702/117; 702/120; 714/724; 714/737; 714/742; 714/718; 324/73.1
[58] Field of Search ..................... 702/117, 120, 702/119, 123; 324/73.1; 714/736, 744, 724, 741, 742, 737, 718

[56] References Cited

U.S. PATENT DOCUMENTS

| | | | |
|---|---|---|---|
| 4,348,759 | 9/1982 | Schnurmann | 714/712 |
| 4,544,882 | 10/1985 | Flora | 714/744 |
| 4,736,373 | 4/1988 | Schmidt | 714/711 |
| 4,768,195 | 8/1988 | Stoner et al. | 714/736 |
| 5,650,732 | 7/1997 | Sakai | 324/755 |
| 5,751,728 | 5/1998 | Katanosaka | 714/719 |
| 5,971,808 | 6/1999 | Kosbab | 370/254 |

OTHER PUBLICATIONS van de Goor, A.J.; van der Arend, P.C.M.; Tromp, G.J.; "Functional Memory Array Testing" CompuEuro '90, Proceedings of the 1990 IEEE International Conference on Computer Systems and Software Engineering, pp. 408–415, 1990.

Ashtijou, M.; Fusheng Chen; "Functional Testing of RAMs by Random Testing Simulation", Memory Testing, 1993, Records of the 1993 IEEE International Workshop, pp. 44–48, 1983.

U.S. Patent Application Serial No. 09/026,873, filed Feb. 20, 1998, entitled Method for Classifying Electronic Devices.

Primary Examiner—Marc S. Hoff
Assistant Examiner—Hien Vo
Attorney, Agent, or Firm—Trop, Pruner & Hu, P.C.

[57] ABSTRACT

An apparatus for classifying a device as being a first device type or a second device type, includes a fixture for coupling at least one device to be identified to the system; and a processor coupled to the fixture. The processor is programmed to test at least one predetermined terminal of the device and designate the type of the device based upon the results of the test

21 Claims, 3 Drawing Sheets

DEVICE FOR CLASSIFYING ELECTRONIC COMPONENTS

BACKGROUND OF THE INVENTION

1. Field of the Invention

The invention relates generally to testing electronic components and, more specifically, to distinguishing one type of component from another type of component packaged in the same style of package.

2. Description of Related Art

Electronic components, or "chips," generally comprise a small piece of semiconducting material (usually silicon) on which an integrated circuit is embedded. The semiconducting material is packaged within an encapsulation, such as a plastic case, with a plurality of terminals, also referred to as pins, legs or leads, extending from the component case. Different types of chips include microprocessor chips, which contain a entire processing unit, and memory chips, which store data.

Common component packages include dual in-line packages (DIP), which are the traditional bug-like chips that have anywhere from 8 to over 40 terminals configured to extend through holes in a printed circuit board, evenly divided in two rows Pin-grid arrays (PGA) are square chips in which the pins are arranged in concentric squares, and single in-line packages (SIP) are chips that have just one row of legs in a straight line like a comb. In addition to these types of chips, there are also single in-line memory modules (SIMM) and dual in-line memory modules (DIMM), which consist of several memory chips packaged as a single unit. Other types of chips include small outline packages (SOP), which include terminals configured for surface mounting, wherein the chip terminals are connected to the surface of a printed circuit board, rather than extending through a hole in the circuit board. Variations on SOPs include shrink small outline packages (SSOP), very small outline packages (VSOP), thin small outline packages (TSOP) and thin shrink small outline packages (TSSOP).

Electronic components, such as memory chips, are customarily manufactured in multiple configurations. For example, a single type of memory chip may include variations which store different amounts of data, or there may be various ways to arrange the data stored within the memory chip. These various configurations, however, may be packaged in identical chip packages, making the various configurations indistinguishable to one simply looking at the chip.

In most manufacturing processes, including manufacturing electronic components such as chips, a series of checks and inspections are typically employed to insure that quality standards are met. Often, these quality assurance tests are simply "pass-fail" checks, though this is not necessarily the most practical manufacturing practice. While manufacturers may prefer to only ship products conforming to the highest standards, this is not always economically feasible, since different applications for manufactured items require different quality or reliability levels. Since, the manufacturing cost generally increases as the quality level increases, manufacturers need to use as many products produced as possible.

For example, computer memory devices are manufactured to store a predetermined amount of data. Computer random access memory (RAM), or main memory, can be thought as an array of boxes, each of which can hold a single byte of information. A memory device that stores one megabyte (meg) of memory, therefore, can hold about one million bytes (or characters) of information. There are several types of computer memory devices, including static RAM (SPAM), dynamic RAM (DRAM) and synchronous DRAM (SPAM). Thus, a 16 meg DRAM is supposed to hold approximately 16 megs of data.

If, during quality assurance testing, a 16 meg DRAM is found to have some defective arrays, such that the 16 meg DRAM only is capable of storing 15 megs of data, it typically would fail the quality assurance test and be scrapped. A scrapped DRAM may also be referred to as a "partial" or a "partial DRAM." If components such as the partial DRAMs are retested and the bad arrays are identified, there are many applications which can use these partials, preventing waste and reducing manufacturing costs. Some manufacturers have implemented "component recovery" programs to make use of sub-performing components such as these partial DRAM chips. Other companies specialize in component recovery, buying products which may have been rejected during the initial manufacturing process, then sorting, retesting, and grading the products for use in their own products where appropriate, or reselling them for use in suitable applications.

A significant problem with current component recovery programs occurs when the component fails the original quality assurance test, and the initial manufacturing process for the failing component halts. These parts are not marked to identify the component type on the component package. Many different types or configurations of electronic components may be contained in packages that look identical, Absent an indication of the component type on the package, it is impossible to identify the component visually. Moreover, even if the components are marked, a component recovery company who purchases graded components or partials may demark the component so that it may be remarked with the recovery company's identifier. This demarking process must occur prior to component testing to insure that the demarking process did not damage the component.

This, a need exists for a system and method for distinguishing one component type from another component type that is contained in the same package style,

SUMMARY OF THE INVENTION

In one aspect of the invention, an apparatus for classifying a device as being a first device type or a second device type includes a fixture for coupling at least one device, to be identified to the system and a processor coupled to the fixture. The processor is programmed to test at least one predetermined terminal of the device and designate the type of the device based upon the results of the test.

BRIEF DESCRIPTION OF THE DRAWINGS

Other objects and advantages of the invention will become apparent upon reading the following detailed description and upon reference to the drawings in which.

Figure 1:
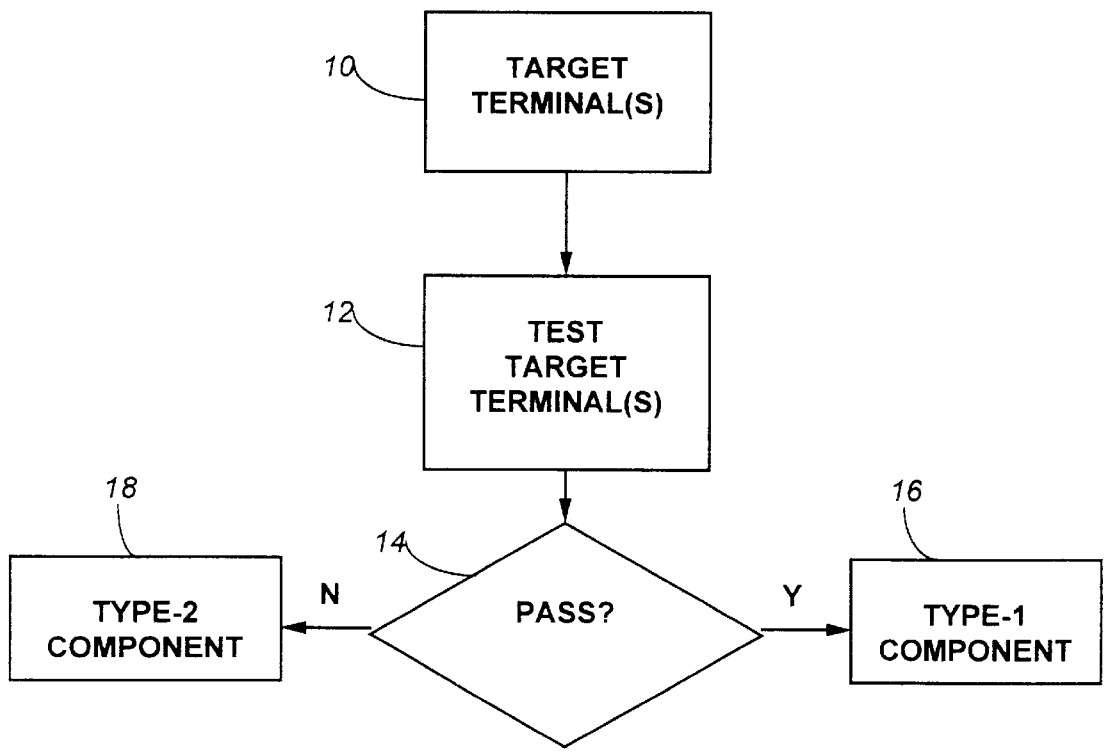
FIG. 1 is a flow diagram illustrating steps for classifying components in accordance with an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure Method of the First Embodiment FIG. 1 illustrates a flow diagram of one particular embodiment a method in accordance with the invention for classifying an electronic device as a first device type or a second device type, wherein both device types are packaged in the same style of package. Often, different types of components or component variations packaged in the chip package style use the component terminals, or pins, for different purposes. Sometimes, terminals used for one component variation are unused with another component variation. In block 10 of FIG. 1, selected terminals are identified, or "targeted." For example, terminals that are used in a first device type but not used in a second device type may be targeted. Alternately, terminals that are used by a first component for one purpose but which are used for a different purpose in a second component may be targeted.

A test is performed on the target terminals in block 12 of FIG. 1. In decision block 14, it is determined whether the component passed the test. Components that pass the test of block 12 are identified as components of the first type, or "type-1" components in block 16, and those that fail are identified as components of the second type, or "type-2" components in block 18. In one particular embodiment of the invention, the test performed in block 12 is a continuity test on the targeted terminals.

Component Tester

Figure 2:
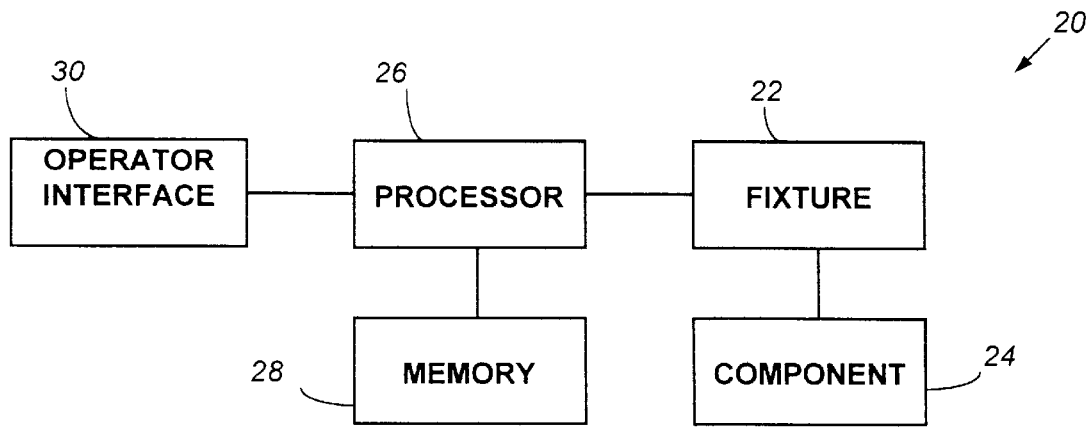
FIG. 2 illustrates a simplified block diagram of component tester in accordance with an embodiment of the present invention.

In FIG. 2, a simplified block diagram of a component tester 20 suitable for an embodiment of the present invention is illustrated. Examples of component testers which may be used with the present invention include a Genesis II or a Teradyne model J994, both available from Teradyne, Inc. The Genesis It tester is a personal computer (PC) based tester which can test up to 32 devices in parallel. The Teradyne J994 tester is a SUN® workstation based tester which allows up to 64 devices to be tested in parallel.

Each tester 20 includes, in general, a fixture 22 which electrically couples the terminals of at least one component 24 to be tested to the tester 20, a processor 26 and a memory storage device 28 which contains the instructions for testing the component 24 in accordance with the invention. The processor 26 may be any conventional general purpose single- or multi-chip microprocessor such as a Pentium® processor, a Pentium® Pro processor, a 8051 processor, a MIPS® processor, a Power PC® processor, or an ALPHA® processor. Moreover, the processor 26 may be an integral component of a personal computer or mini computer, for example, which is an element of the component tester 20. The memory device 28 may be any conventional computer storage device readable by the processor 26, such as a computer hard drive, a compact disk, magnetic tape, or a floppy diskette, and also may be an element of a computer associated with the tester 20. The component tester 20 further includes an operator interface 30, which, for example, may include a standard computer video display, a keyboard and a pointing device such as a mouse or trackball.

Method of the Second Embodiment

Figure 3:
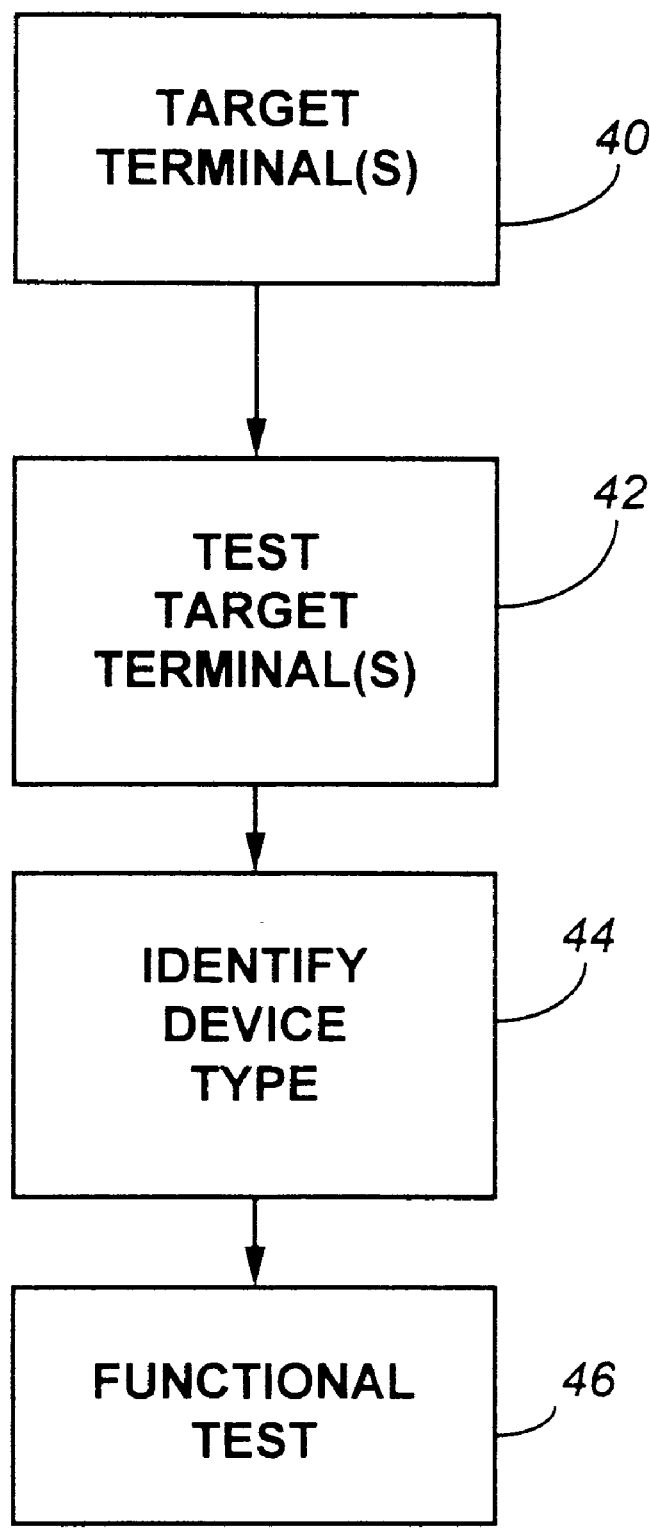
FIG. 3 is a flow diagram illustrating an alternate embodiment of a method for classifying components functional accordance with the invention.

An alternate embodiment of the invention is illustrated in FIG. 3. Target terminals are identified in block 40, then a first test is performed on the target terminals in block 42. The component is initially identified as a type-1 or type-2 component in block 44. Following the initial component identification in block 44, a second test is performed in block 46 on the chips. In one particular embodiment, components which fail the first component test 42 and are identified as type-2 components in block 44 are additionally tested by performing a functional test on these components. In other words, a test that a properly functioning type-2 component would pass, but a properly functioning type-1 component would fail may be used in block 46 Thus, passing the functional test 46 after being initially identified as a type-2 component gives further assurances that the component has been properly identified.

Method of the Third Embodiment

One particular embodiment in accordance with the present invention distinguishes different configurations of SDRAM chips. An SDRAM is designed to operate in a synchronous memory system. Thus, all operations in the SDRAM are synchronized to a clock signal. A memory array is divided into two or more banks for storing data, with each bank memory array including storage cells organized in rows and columns. A typical arrangement of a 16 meg SDRAM chip includes two bank memory arrays, each comprising four separate arrays of 2048 rows×1024 columns. This arrangement is referred to as a "4 meg×4" SDRAM. The 4 meg×4 SDRAM chip further includes four input/outputs, or "DQs," each coupled to a terminal of the component package, thus, the 4 meg×4 SDRAM chip includes four DQ terminals. An alternate 16 meg SDRAM arrangement is the 2 meg×8, which also includes two bank memory arrays. Each of the memory arrays in the 2 meg×9 includes eight separate arrays of 2048 rows×512 columns, with eight DQs. Therefore, the 2 meg×8 SDRAM chip has eight DQ pins. Examples of the 4 meg×4 and 2 meg×8 SDRAMs include Micron Technology, Inc. part numbers MT48LC4M4A1 S and MT48LC2M8A1 S, respectively.

The exemplary 2 meg×8 and 4 meg×4 SDRAM configurations mentioned above are packaged in 44-pin thin shrink small outline packages (TSOPs). In other words, the 2 meg×8 and the 4 meg×4 SDRAM components as packaged are indistinguishable from each other absent some labeling on the package case. In component recovery processes, component manufacture is often interrupted prior to marking the components or the component is demarked prior to testing, as discussed above. One embodiment of the present invention distinguishes one unmarked SDRAM configuration from the other.

The TSOP package includes a main body and 44 terminals, or pins, electrically coupled to various functional portions of the component, with the terminals extending from the main body. Often, chips do not use all of the terminals extending from the package body, as is the situation with the SDRAM components described above, which do not use all 44 pins. The unused pins are simply not connected to the circuit, or in other applications, they may be coupled to ground.

As discussed above, the 2 meg×8 SDRAM configuration includes eight DQs, and the 4 meg×4 configuration includes four DQs. The 2 meg×8 configuration's eight input/outputs, DQ0–DQ7, are on pins 2, 4, 6, 8, 37, 39, 41 and 43 of the package, respectively. In comparison, the 4 meg×4 SDRAM has four input/outputs, DQ0–D3, on pins 4, 9, 37 and 41, respectively. Pins 2, 6, 39 and 43 of the 4 meg×4 configuration SDRAM are not connected to the circuit. Thus, in the first device (the 2 meg×8 SDRAM configuration), four pins (pins 2, 6, 39 and 43) are connected to input/outputs, while these same four pins are unused in the second device (the 4 meg×4 SDRAM configuration).

The component tester 20 in accordance with the invention includes a processor 26 and a memory storage device 28 which may be integral to a personal computer or other type of computer. To distinguish the 2 meg×8 SDRAM chips (type-1 component) from the 4 meg×4 SDRAM chips (type-2 component), the components 24 to be identified are coupled to the tester's fixture 22. Instructions are stored in the memory storage device 28 that when executed by the processor 26 cause the tester 20 to perform a continuity check as is known in the art, on the component 24 terminals which are coupled to DQ pins present in the 2 meg×8 chip but not present in the 4 meg×4 SDRAM chip Thus, terminals 2, 6, 39 and 43 of the 44-pin TSOP package, corresponding to DQ pins 0, 2, 5 and 7 of the 2 meg×8 SDRAM chip, are targeted for being tested. If the continuity check on any of these terminals passes, the chip is identified as the 2 meg×8 component (type-1).

In an exemplary embodiment of the invention, the continuity check performed by the tester 20 includes 1) applying a constant current to the ground (Vss) pin, 2) measuring the voltage across each pin with reference to ground, and 3) any voltage between 0 v and −2 v is passing, The above actions are for conventional current flow (current flows from positive to negative). For negative current flow (current flows from negative to positive) the polarities of the voltage is reversed.

Figure 4:
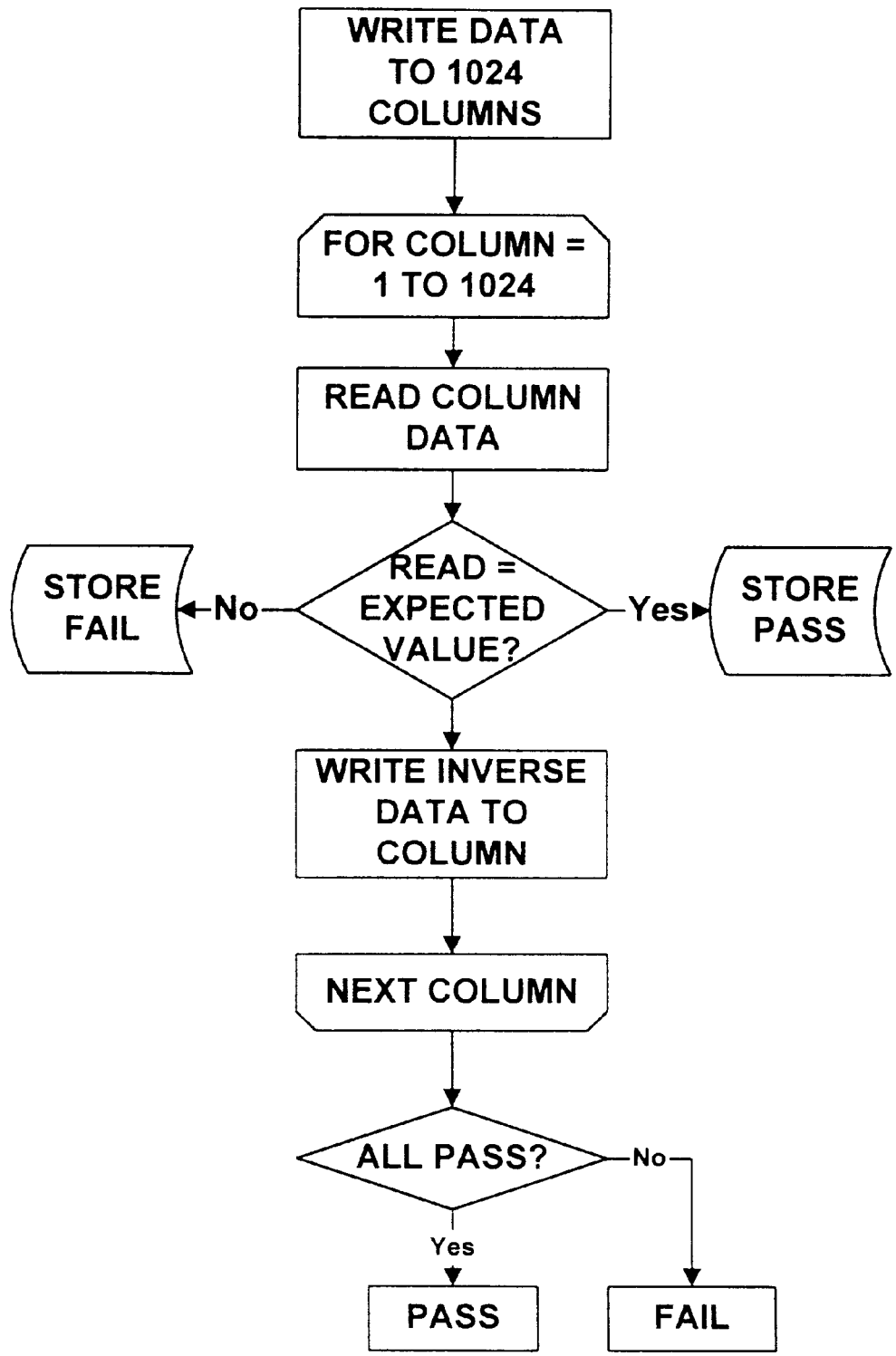
FIG. 4 is a flow diagram illustrating a functional component test in accordance with an embodiment of the invention.

Additionally, the tester's processor 26 may be programmed to perform subsequent tests on the components 24. In an embodiment of the invention, a functional test is performed on components 24 failing the continuity check. An example of a functional test used in the process of distinguishing the 4 meg×4 from the 2 meg×8 SDRAM is known as a "read-modified write" test. FIG. 4 illustrates a read-modified write test. The test comprises writing data of a given logic level to 1024 columns of a single row of one bank, but not both barks, of components initially identified as 4 meg×4 SDRAMs in block 60. The data are read from each column in block 62, then over-written with data of a logic level inverse to the data read in block 64.

More specifically, in a 4 meg×4 SDRAM, which has 1024 columns in each memory array, data of the given logic level, for example, logic 1, will be written to each column in the row in block 60. Each logic 1 will then be read (62), then over-written with a logic 0 (64). In block 66, the from the over-write is compared to the data originally written to the column. In the 4 meg×4 SDRAM, each column of the row ends up with data of a logic level inverse to the data originally written, passing the test and confirming the 4 meg×4 identification.

A 2 meg×8 SDRAM, which only has 512 columns in each memory array, will fail this functional test. For example, in the functional test described above, logic 1's are written to 1024 columns of a single row in the 2 meg×8 SDRAM chip in block 60. Since the memory array of the 2 meg x 8 chip only has 512 columns, 512 logic 1's will be written, then another 512 logic 1's will be written to the same 512 columns (data are written to only one row). The same process occurs during the read-modified write portion of the test. In other words, the logic 1 written to each of the first 512 columns is read in block 62, then over-written with a logic 0. Now, all 512 columns contain a logic 0. The test, however) performs the read-modified write to 1024 columns of one row. Therefore, the next 512 read-modified writes will repeat on the same row. The logic 0's written during the first 512 read-modified writes will now be read and over-written with logic 1's, so the test finishes with each column containing a logic 1, which is the same logic level as originally written. Hence, the functional test fails, and the part is identified as a 2 meg×8 SDRAM.

The process for distinguishing disclosed herein may also be applied to other types of memory devices, such as conventional DRAM chips. For example, the invention could be embodied to distinguish 16 meg×4 DRAM chips from 8 meg×8 DRAM chips. As with the SDRAM chips, the component DQ connections may be used to distinguish the different memory configurations. Examples of these DRAM chips include Micron Technology, Inc. part numbers MT4LC16M4G3 and MT4LC16M4H9 (16 meg×4) and MT4LC8M8P4 and MT4LC8MSC2 (8 meg×8), These DRAM configurations are packaged in 32-pin packages, with the 8 meg×8 configuration having eight input/outputs, DQ1–DQ8, coupled to terminals 2, 3, 4, 5, 28, 29, 30 and 31 of the package, respectively. The 16 meg×4 configuration has 4 input/outputs, DQ1–DQ4, coupled to terminals 2, 3, 30, and 31 of the package, respectively. Thus, pins 4, 5, 28, and 29 of the 16 meg×4 package may be targeted for a continuity test or other test to determine whether the terminal is used by the component.

The processor 26 could further be programmed to subsequently perform a suitable functional test on these components. The read-modified write test could be modified and applied to memory device configurations which have bank memories arranged in rows and columns, wherein the devices have different numbers of columns. To perform the test, the number of columns included in the memory configuration having the greater number of columns must be identified. Next, data of a given logic level are written to a number of columns of a single row equal to this number of columns, followed by a read modified write to the same number of columns, A component having fewer columns will fail this test. Other functional tests suitable for the components being distinguished may also be used.

By way of example, the embodiments of the invention disclosed thus far have applied to specific memory devices One skilled in the art with the benefit of this specification, however, could apply the invention to other types of components. The present invention may be embodied to identify virtually any device as being one type or another type packaged in the same, or similar package styles, wherein one of the device types uses at least one terminal that is unused by the other device type. Once the target terminal is identified, the processor 26 may be programmed to perform an appropriate test, such as a continuity check, to determine whether the terminal is used (connected) in the component 24 being tested. If the terminal is not being used (is unconnected), it is identified as the second component. Subsequently, a functional test may be performed to the verify this identification.

The above description of exemplary embodiments of the invention are made by way of example and not for purposes of limitation, Many variations may be made to the embodiments and methods disclosed herein without departing from the scope and spirit of the present invention. The present invention is intended to be limited only by the scope and spirit of the following claims.

What is claimed is:

1. An apparatus for classifying a device as being a first device type or a second device type, wherein the first device type and the second device type comprise a first number of terminals, the apparatus comprising:
    a fixture for coupling at least one device to be identified to the apparatus; and
    a processor coupled to the fixture, the processor programmed to test at least one predetermined terminal of the device and designate the device as one of the first and second device types based upon whether the predetermined at least one terminal is used or unused in the device.

2. The apparatus of claim 1, further comprising an element to perform a continuity test of the at lest one predetermined terminal, the processor designating the device type based on the continuity test.

3. The apparatus of claim 2, wherein the processor is programmed to further perform a functional test to verify designation of one of the first and second device types based on the continuity test.

4. The apparatus of claim 1 further comprising a memory storage device accessible by the processor.

5. The apparatus of claim 4 further comprising an operator interface.

6. The apparatus of claim 5 wherein the processor, the memory storage device, and the operator interface are components of a computer.

7. The apparatus of claim 1 wherein the processor is programmed to functionally test the device.

8. The apparatus of claim 1 wherein the device comprises a Memory device.

9. The apparatus of claim 1 wherein the device comprises an SDRAM, the first device type comprises a 4 meg×4 configuration and the second device type comprises a 2 meg×8 configuration.

10. An apparatus for distinguishing SDRAM components in a 4 meg×4 configuration from SDRAM components in a 2 meg×8 configuration, both SDRAM configurations being packaged in the same package style, the package including a plurality of terminals, the apparatus comprising:
    a fixture for coupling at least one SDRAM component to the apparatus; and
    a processor coupled to the fixture, the processor programmed to check continuity on the package terminals coupled to input/outputs which are present in the 2 meg×8 configurations but not present in the 4 meg×4 configuration.

11. The apparatus of claim 10 wherein the package includes a ground terminal and the processor is programmed to execute the acts of:
    applying a constant current to the ground terminal; and
    measuring the voltage across each of the package terminals coupled to input/outputs which are present in the 2 meg×8 configuration but not present in the 4 meg×4 configuration with reference to ground.

12. The apparatus of claim 10 wherein the processor is programmed to functionally test the component.

13. The apparatus of claim 12 wherein the processor is programmed to execute a functional test which a properly functioning 4 meg×4 SDRAM will pass but which a properly functioning 2 meg×8 SDRAM will fail.

14. The apparatus of claim 12 wherein the processor is programmed to functionally test the components failing the continuity check.

15. The apparatus of claim 12 wherein the SDRAM includes a pair of bank memory arrays each having storage cells organized in rows and columns, further comprising the processor being programmed to execute the acts of:
    writing data of a given logic level to 1024 columns of one row of one bank;
    reading the data written to the 1024 columns in the writing data act; and
    over-writing the data read with data of an inverse logic level to the data read.

16. A program storage apparatus storing instructions that when executed by a computer perform a method of classifying a device as a first device type or a second device type, wherein both the first device type and the second device type comprise an identical number of terminals, the method comprising the acts of testing at least one predetermined terminal of the device and classifying the device as the second device type if the predetermined at least one terminal is unused.

17. The program storage apparatus of claim 16 wherein the device includes a ground terminal, the program storage apparatus further storing instructions that when executed by a computer perform the acts of:
    applying a constant current to the ground terminal; and
    measuring the voltage across the at least one predetermined terminal with reference to ground.

18. The program storage apparatus of claim 16 further storing instructions that when executed by a computer perform a functional test on the device.

19. An apparatus for classifying a device as being a first device type or a second device type, the apparatus comprising:
    a fixture for coupling at least one device to be identified to the apparatus; and
    a processor adapted to perform a first test of at least one target terminal of the device and to identify the device type based upon the results of the first test, the processor adapted to perform a functional test on the device, wherein the functional test comprises a test which a properly functioning device of the first device type will pass but which a properly functioning device of the second device type will fail.

20. The apparatus of claim 19, wherein the first test includes a continuity test.

21. The apparatus of claim 19, wherein the processor performs the functional test on a device that fails the first test.

* * * * *